(12) United States Patent
Ngo et al.

(10) Patent No.: US 6,645,853 B1
(45) Date of Patent: Nov. 11, 2003

(54) INTERCONNECTS WITH IMPROVED BARRIER LAYER ADHESION

(75) Inventors: Minh Van Ngo, Freemont, CA (US); Dawn Hopper, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/001,805

(22) Filed: Dec. 5, 2001

(51) Int. Cl.[7] .......................................... H01L 21/4763
(52) U.S. Cl. ......................................................... 438/637
(58) Field of Search ................................. 438/638, 637, 438/643, 639, 648, 687, 675, 685, 781, 775, 776

(56) References Cited

U.S. PATENT DOCUMENTS

| | | | |
|---|---|---|---|
| 5,464,792 A | * 11/1995 | Tseng et al. | 438/585 |
| 5,801,097 A | * 9/1998 | Chang | 438/643 |
| 6,143,650 A | 11/2000 | Pramanick et al. | |
| 6,146,996 A | 11/2000 | Sengupta | |
| 6,271,120 B1 | 8/2001 | Huang et al. | |
| 6,319,766 B1 | 11/2001 | Bakli et al. | |

* cited by examiner

*Primary Examiner*—Matthew Smith
*Assistant Examiner*—Chuong Luu

(57) ABSTRACT

Semiconductor devices comprising interconnect with improved adhesion of barrier layers to dielectric layers are formed by laser thermal annealing exposed surfaces of a dielectric layer in an atmosphere of $NH_3$ and $N_2$, and subsequently depositing Ta to form a composite barrier layer. Embodiments include forming a dual damascene opening in an interlayer dielectric comprising F-containing silicon oxide, such as F-containing silicon oxide derived from F-TEOS, laser thermal annealing the exposed silicon oxide surface in $NH_3$ and $N_2$, depositing Ta and then filling the opening with Cu. Laser thermal annealing in $NH_3$ and $N_2$ depletes the exposed silicon oxide surface of F while forming an $N_2$-rich surface region. Deposited Ta reacts with the $N_2$ in the $N_2$-rich surface region to form a composite barrier layer comprising a graded layer of tantalum nitride and a layer of α-Ta thereon.

13 Claims, 2 Drawing Sheets

INTERCONNECTS WITH IMPROVED BARRIER LAYER ADHESION

TECHNICAL FIELD

The present invention relates to copper (Cu) and/or Cu alloy metallization in semiconductor devices, and to a method for manufacturing semiconductor devices with reliable, low resistance Cu or Cu alloy interconnects. The present invention is particularly applicable to manufacturing high speed integrated circuits having submicron design features and high conductivity interconnect structures.

BACKGROUND ART

The escalating demand for high density and performance impose severe requirements on semiconductor fabrication technology, particularly interconnection technology in terms of providing reliable low R×C (resistance×capacitance) interconnect patterns with higher electromigration resistance, wherein submicron vias, contacts and trenches have high aspect ratios. Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through interdielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

In implementing Cu metallization, particularly in damascene techniques wherein an opening is formed in a dielectric layer, particularly a dielectric layer having a low dielectric constant, e.g., a dielectric constant less than about 3.9, various reliability, electromigration and resistance issues are generated. Reliability issues stem, in part, from the use of Ta or TaN, the barrier layers of choice in Cu metallization. Ta has been found to lack adequate adhesion to various interlayer dielectric materials, particularly, interlayer dielectric materials having a low dielectric constant, such as, a dielectric constant (k) less than about 3.9 such as, fluorine (F)-containing oxides, e.g., F-containing silicon oxide derived from F-doped orthosilicate (F-TEOS). Lack of sufficient barrier layer adhesion to dielectric layers results in delamination with attendant reliability issues. TaN has been found to lack adequate adhesion to Cu and Cu alloys filling a damascene opening. Moreover, Ta and TaN are typically deposited by physical vapor deposition (PVD) techniques, such as ionized (I) PVD. The resulting layer of Ta is typically β-phase Ta (β-Ta) which exhibits a relatively high resistivity, e.g., about 200 to about 250 μohm-cm. TaN is typically deposited with a nitrogen ($N_2$) content of about 30 to about 55 at. %, and exhibits a resistivity in excess of 200 μohm-cm.

The barrier layer adhesion problems adversely impact electromigration resistance and device reliability, while the high resistivity of TaN and β-Ta manifestly adversely impact circuit speed. Accordingly, there exists a need for reliable, low resistance interconnects, particularly Cu and Cu alloy interconnects formed in low dielectric constant materials, and for enabling methodology.

DISCLOSURE OF THE INVENTION

An advantage of the present invention is a semiconductor device having reliable, low resistance interconnects, such as Cu or Cu alloy interconnects, exhibiting improved electromigration resistance.

Another advantage of the present invention is a method of manufacturing a semiconductor device having reliable, low resistance interconnects, such as Cu or Cu alloy interconnects, with improved electromigration resistance.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a method of manufacturing a semiconductor device, the method comprising: forming an opening in a dielectric layer; laser thermal annealing exposed surfaces of the dielectric layer in ammonia ($NH_3$) and nitrogen ($N_2$); and forming a composite barrier layer comprising tantalum (Ta) lining the opening.

Another advantage of the present invention is a semiconductor device comprising: an opening in a dielectric layer; and a composite barrier layer formed on a surface of the dielectric layer lining the opening; wherein: the surface of the dielectric layer comprises a nitrogen ($N_2$)-enriched surface region; and the composite barrier layer comprises: an initial graded layer of tantalum nitride, containing $N_2$ in an amount decreasing in a direction away from the $N_2$-enriched surface region; and a layer of $\alpha$-Ta on the graded tantalum nitride layer.

Embodiments include forming a dual damascene opening in a dielectric layer having a low dielectric constant (k) less than about 3.9, such as F-containing silicon oxide derived from F-TEOS, and impinging a pulsed laser light beam on exposed surfaces of the F-containing silicon oxide layer employing an $NH_3$ flow rate of about 200 to about 2,000 sccm and a $N_2$ flow rate of about 200 to about 2,000 sccm, for a brief period of time, e.g., about 10 to about 100 nanoseconds, thereby elevating the temperature of the exposed surfaces to about 370° C. to about 430° C., such that the laser thermal annealed exposed surfaces become depleted in F and enriched in $N_2$. Ta is then deposited, as by IPVD, such that the deposited Ta reacts with $N_2$ in the $N_2$-enriched surfaced region to form a graded layer of tantalum nitride thereon. Upon continuing deposition, a layer of $\alpha$-Ta is formed on the graded titanium nitride layer.

Embodiments of the present invention further include single and dual damascene techniques comprising forming an opening in a dielectric layer or layers on a wafer, laser thermal annealing exposed surfaces of the dielectric layer or layers in $NH_3$ and $N_2$, depositing Ta to form a composite diffusion barrier layer of graded tantalum nitride/$\alpha$-Ta, lining the opening and on the dielectric layer(s), depositing a seedlayer, depositing the Cu or a Cu alloy layer on the seedlayer filling the opening and over the dielectric layer(s), removing any portion of the Cu or Cu alloy layer beyond the opening by CMP leaving an exposed surface and depositing a silicon nitride or silicon carbide capping or barrier layer on the treated surface.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
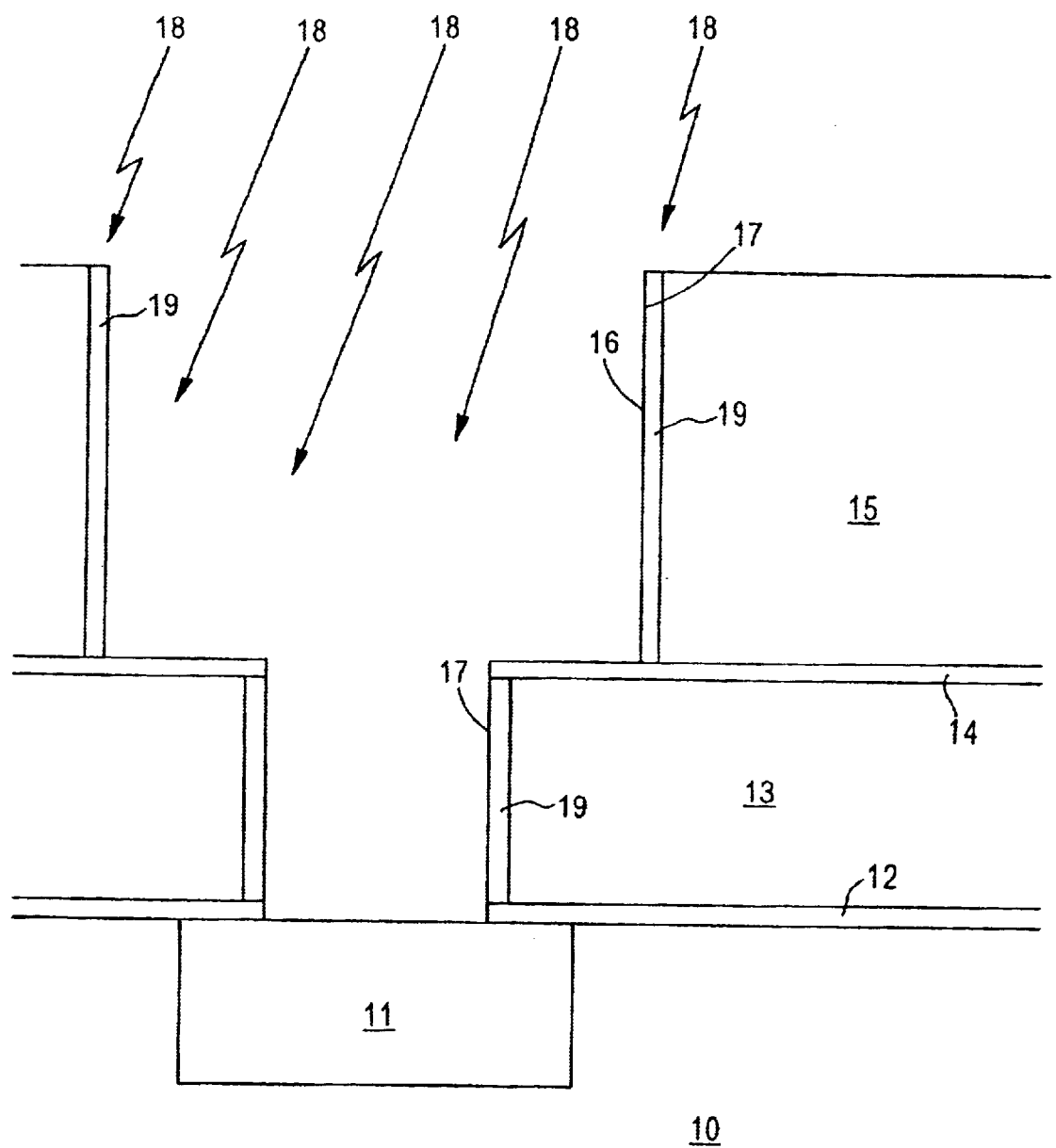
FIGS. 1 and 2 schematically illustrate sequential phases of a method in accordance with an embodiment of the present invention.

The present invention addresses and solves various problems attendant upon forming metallized interconnects, such as Cu or Cu alloy interconnects, particularly, damascene structures in dielectric layer(s) having a dielectric constant less than about 3.9, such as F-containing dielectric material, e.g., F-containing silicon oxide derived from F-TEOS. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, electromigration and contact resistance issues associated with interconnects, particularly Cu interconnects, become increasingly significant. Reliability and electromigration issues stem, in part, from the poor adhesion of β-Ta to various low-k dielectric materials and poor adhesion of TaN to Cu and Cu alloys. TaN and β-Ta exhibit high resistivities, thereby adversely impacting circuit speed.

The present invention addresses and solves such problems by performing laser thermal annealing, as by impinging a pulsed laser light beam, in $NH_3$ and $H_2$, on exposed surfaces of the dielectric layer prior to barrier layer deposition. Laser thermal annealing in $NH_3$ and $N_2$ modifies the surface of the dielectric layer such that a $N_2$-enriched surface region is formed. Subsequently, during Ta deposition, a titanium nitride layer is initially formed having a graded $N_2$ concentration such that the amount of $N_2$ decreases in a direction away from the $N_2$-enriched surface region. Continued Ta deposition results in the formation of a thin $\alpha$-Ta layer on the graded tantalum nitride layer. The resulting composite barrier layer, comprising the graded tantalum nitride layer in contact with dielectric material and a layer of $\alpha$-Ta in contact with the Cu metallization, solves adhesion issues generated by the poor adhesion of β-Ta to dielectric material and the poor adhesion of tantalum nitride to Cu metallization. Deposition of Ta on a layer of tantalum nitride advantageously results in $\alpha$-Ta, since the graded tantalum nitride layer serves as a template for the growth of $\alpha$-Ta, a low resistivity form of Ta, typically exhibiting a resistivity of about 40 to about 50 µohm-cm vis-à-vis about 200 to about 250 µohm-cm for β-Ta. It was found particularly advantageous to deposit Ta by IPVD, e.g., ionized sputter deposition (ISD).

The initial layer of graded tantalum typically has a thickness of about 20 Å to about 50 Å, while the layer of $\alpha$-Ta is typically deposited at a thickness of about 200 Å to about 300 Å. The layer of graded tantalum nitride typically contains nitrogen in an amount from a value of about 10 to about 40 at. %, proximate the $N_2$-enriched surface region of the dielectric layer to zero proximate the $\alpha$-Ta layer.

It should be understood that suitable Ta deposition conditions are dependent upon the particular situation and can be optimized accordingly. It was found suitable, for example, to employ an argon (Ar) flow rate of about 40 to about 60 sccm, e.g., about 45 to about 60 sccm, a D.C. power of about 1,000 to about 40,000 watts, an RF power of about 1,000 to about 3,000 watts, and a pressure of about 1 to about 45 mTorr, depending upon the particular deposition system and technique.

Embodiments of the present invention comprise utilizing halogen-doped dielectric layers, such as F-doped dielectric layers, i.e., F-doped silicon oxide derived from F-TEOS. In implementing such embodiments, laser thermal annealing of the exposed surfaces of the dielectric layer results not only in $N_2$ enrichment of a surface region but also F depletion. The resulting surface region typically has a thickness of about 10 Å to about 20 Å and contains a lower amount F than the remainder of the dielectric layer. It is believed that during laser thermal annealing, $NH_3$ releases hydrogen which reacts with F in the surface portion of the dielectric layer forming hydrofluoric acid (HF) which is carried out of the chamber, thereby depleting the surface region of F. The surface region then becomes enriched with $N_2$ which is present during laser thermal annealing.

The use of laser thermal annealing advantageously enables pinpoint targeting of the exposed surfaces of the dielectric layer to form the $N_2$-enriched surfaced region in a relatively short period of time without unnecessarily heating different areas of the wafer, thereby avoiding various adverse consequences, such as problematic dopant diffusion issues. In implementing embodiments of the present invention, any of various conventional laser systems can be employed, such as an excimer or Nd-YAG pulse laser. Commercially available laser tools for laser annealing, either with or without a mask, are available, such the Verdant Technologies laser anneal tool operating at an exposure wavelength of 308 nm. Available laser sources are capable of operating at energies of from about 10 to about 2,000 $mj/cm^2$/pulse. Suitable operating conditions can be determined in a particular situation. For example, it was found suitable to subject the exposed surfaces of the dielectric layer to laser thermal annealing by impinging a pulsed laser light beam at a radiant fluence of about 0.09 to about 0.11 joules/$cm^2$ thereby heating the exposed surfaces of the dielectric layer to a temperature of about 370° C. to about 430° C. employing a $N_2$ flow rate of about 200 to about 2000 sccm and an $NH_3$ flow rate of about 200 to about 2000 sccm.

Figure 2:
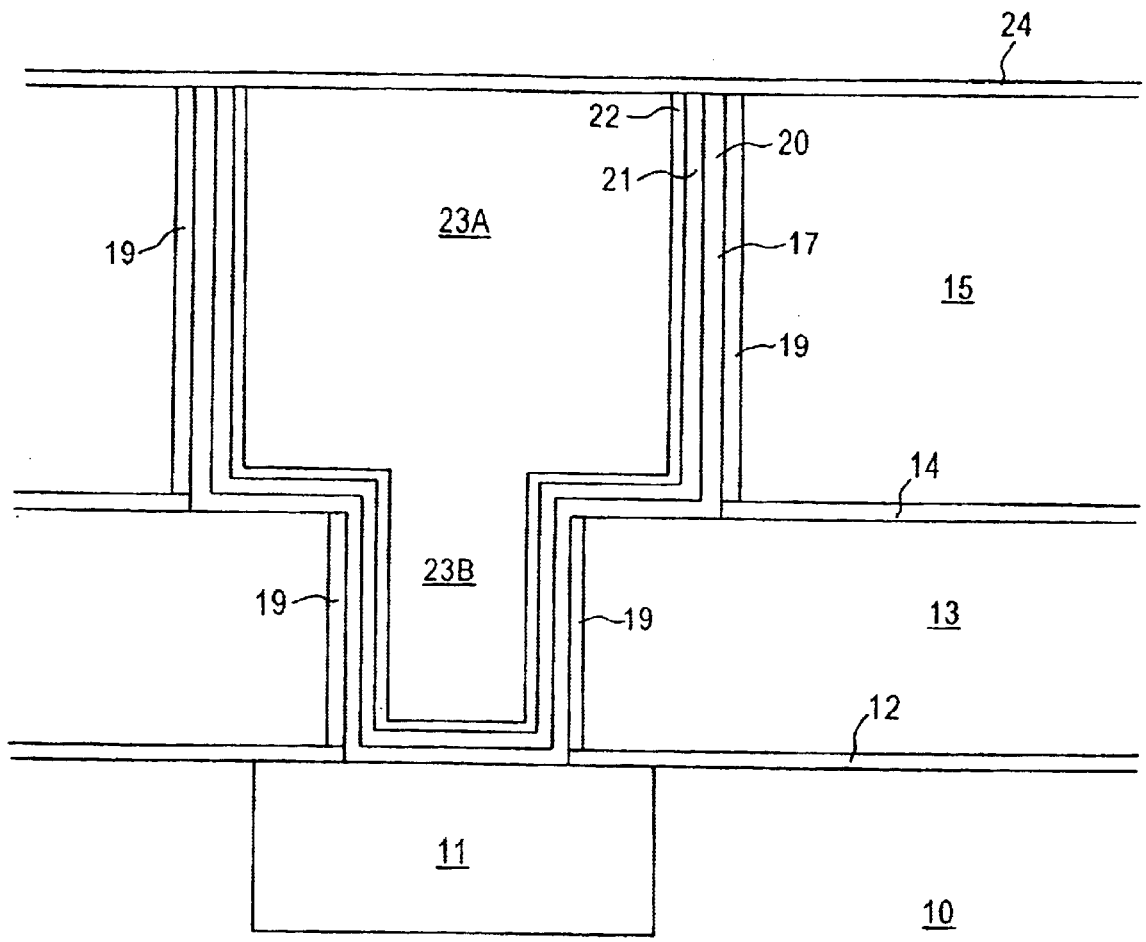

Embodiments of the present invention include single damascene structures as well as dual damascene structures. An embodiment of the present invention involving a dual damascene structure is schematically illustrated in FIGS. 1 and 2, wherein similar features or elements are denoted by similar reference characters. Adverting to FIG. 1, lower metal feature 11, e.g., Cu, is formed in an underlying interlayer dielectric 10, e.g., F-containing silicon oxide derived from F-TEOS. A capping layer 12, such as silicon nitride or silicon carbide, is formed on an upper surface of interlayer dielectric layer 10 and a dielectric layer 13, such as a low-k dielectric material, e.g., F-containing silicon oxide derived from F-TEOS, is formed thereon. A middle etch stop layer 14, such as silicon nitride or silicon carbide, is then formed on dielectric layer 13. Another dielectric layer 15, such as, a dielectric layer containing a low-k dielectric material, e.g., F-doped silicon oxide derived from F-TEOS, is then deposited. A dual damascene opening 16 is then formed leaving exposed surfaces 17 of dielectric layers 13 and 15. It should be understood that the dual damascene opening can be formed by either a via first-trench last technique or a trench first-via last technique. The exposed surfaces 17 of dielectric layers 13 and 15 are then subjected to laser thermal annealing, by impinging a pulsed laser light beam thereon, as indicated by arrows 18, thereby forming a surface region 19 depleted in F and enriched in $N_2$.

Adverting to FIG. 2, Ta deposition is then implemented, as by ISD, to sequentially form a graded titanium nitride layer 21 on surface region 19 and a layer $\alpha$-Ta 21 on graded titanium nitride layer 20. A seedlayer 22 can then be deposited followed by electrodeposition or electroless deposition of Cu forming an overburden. CMP is then conducted and a capping layer 24, such as silicon nitride or silicon carbide, is deposited to complete the interconnect structure depicted in FIG. 2 comprising Cu line 23A in communication with Cu via 23B which is in electrical contact with underlying metal feature 11.

In implementing various damascene techniques in accordance with embodiments of the present invention, Cu can be deposited by electroless deposition or electroplating using a seedlayer. Typical seedlayers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenide. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or silane by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from dow Chemical Co., Midland, Miss.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

The present invention enables the manufacture of semiconductor devices having interconnects, particularly Cu interconnects, with significantly improved barrier layer adhesion, improved electromigration resistance, enhanced reliability and reduced contact resistance. The use of laser thermal annealing by impinging a pulsed laser light beam on exposed surfaces of the dielectric layer, particularly a F-doped dielectric layer, enables formation of a surface region depleted in F and enriched in $N_2$. Subsequent Ta deposition results in the formation of a composite barrier layer comprising a graded tantalum nitride layer on the surface region of the dielectric layer and a layer of $\alpha$-Ta deposited thereon. The formation of a composite barrier layer avoids adhesion problems attendant upon conventional practices thereby increasing device reliability and improving electromigration resistance.

The present invention enjoys industrial applicability in the formation of various types of interconnects, particularly inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:
    forming an opening in a dielectric layer
    laser thermal annealing exposed surfaces of the dielectric layer in ammonia ($NH_3$) and nitrogen ($N_2$); and
    forming a composite barrier layer comprising tantalum (Ta) lining the opening.

2. The method according to claim 1, wherein the dielectric layer comprises fluorine (F) containing silicon oxide derived from F-doped tetraethyl orthosilicate (F-TEOS).

3. The method according to claim 2, comprising laser thermal annealing the exposed surfaces to form a surface region depleted in F and enriched in $N_2$.

4. The method according to claim 3, comprising forming the composite barrier layer by depositing Ta, the composite barrier layer comprising:
    a graded layer of tantalum nitride on the $N_2$-enriched surface region, the graded tantalum nitride layer containing $N_2$ in an amount decreasing in a direction away from the $N_2$-enriched surface region; and
    a layer of $\alpha$-Ta on the graded tantalum nitride layer.

5. The method according to claim 4, further comprising filling the opening with copper (Cu) or a Cu alloy.

6. The method according to claim 5, wherein the opening comprises a dual damascene opening having a lower via hole in communication with an upper trench, the method comprising filling the opening with Cu or Cu alloy to form a lower via in communication with an upper line.

7. The method according to claim 6, comprising laser thermal annealing by impinging a laser light beam on the exposed surfaces at a radiant fluence of about 0.09 to about 0.11 joules/cm$^2$.

8. The method according to claim 7, comprising laser thermal annealing to elevate the temperature of about 370° C. to about 430° C.

9. The method according to claim 2, comprising laser thermal annealing employing an $N_2$ flow rate of about 200 to about 2,000 sccm and an $NH_3$ flow rate of about 200 to about 2,000 sccm to form a region on the exposed surfaces depleted in F and enriched in $N_2$.

10. The method according to claim 9, comprising forming the composite barrier layer by depositing Ta, the composite barrier layer comprising:
    a graded layer of tantalum nitride on the $N_2$-enriched surface region, the graded tantalum nitride layer containing nitrogen in an amount decreasing in a direction away from the $N_2$-enriched surface region; and
    a layer of $\alpha$-Ta on the graded tantalum nitride layer.

11. The method according to claim 1, comprising laser thermal annealing the exposed surfaces of the dielectric layer to form a surface region enriched in $N_2$.

12. The method according to claim 11, comprising forming the composite barrier layer by depositing Ta, the composite barrier layer comprising:
    a graded layer of tantalum nitride on the $N_2$-enriched surface region the graded tantalum nitride layer containing $N_2$ in an amount decreasing in a direction away from the $N_2$-enriched surface region; and
    a layer of $\alpha$-Ta on the graded tantalum nitride layer.

13. The method according to claim 11, further comprising filling the opening with copper (Cu) or a Cu alloy.

* * * * *